United States Patent [19]

Chan

[11] 4,392,210

[45] Jul. 5, 1983

[54] ONE TRANSISTOR-ONE CAPACITOR MEMORY CELL

[75] Inventor: Tsiu C. Chan, Carrollton, Tex.

[73] Assignee: Mostek Corporation, Carrollton, Tex.

[21] Appl. No.: 937,272

[22] Filed: Aug. 28, 1978

[51] Int. Cl.[3] .............................................. G11C 11/24
[52] U.S. Cl. ...................................... 365/149; 357/23
[58] Field of Search ....................... 365/149; 357/23 C

[56] References Cited

U.S. PATENT DOCUMENTS

| | | | |
|---|---|---|---|
| 4,012,757 | 3/1977 | Koo | 365/149 |
| 4,164,751 | 8/1979 | Tasch | 365/149 |
| 4,168,538 | 9/1979 | Meusburger | 365/149 |

OTHER PUBLICATIONS

Kuo et al., 16-K RAM Built with Proven Process May Offer High Start-Up Reliability, Electronics, 5/13/76, pp. 81-86.

Lee et al., Merged Charge Memory (MCM), A New Random Access Cell, International Electron Devices Meeting, 1976, Washington, D.C., pp. 5-20.

Boll et al., Design of a High-Performance M24-b Switched Capacitor, p-Channel IGFET Memory Chip, IEEE J. of Solid-State Cir., vol. 8, No. 5, 10/73, pp. 310-318.

Barson et al., High-Density Single-Device Memory Cell, IBM Tech. Disc. Bull., vol. 16, No. 6, 11/73, p. 1698.

Primary Examiner—Stuart N. Hecker

[57] ABSTRACT

An integrated circuit memory cell pair having its data lines insulatively disposed from the semiconductor substrate at all points other than the point of electrical contact to the transistors of each memory cell. The semiconductor substrate has drain and source regions about the transmission channel of the field effect transistor and has a first capacitor electrode integral with one terminal of the transistor. A first polysilicon layer insulatively disposed from the substrate provides a conductive layer for a second capacitor electrode for each memory cell. A second insulatively disposed polysilicon layer provides the gate regions of the transistors and the data lines. The data lines make electrical contact through a self-aligned buried contact. Using this construction, a highly dense memory cell array is achieved without sacrificing capacitor area.

5 Claims, 5 Drawing Figures

ONE TRANSISTOR-ONE CAPACITOR MEMORY CELL

BACKGROUND OF THE INVENTION

I. Field of the Invention

The present invention relates to the field of dynamic memory cells utilized in integrated circuitry. More particularly, the present invention relates to a very high-density integrated circuit memory utilizing a single transistor and a single capacitor for each storage cell.

II. Description of the Prior Art

Memories based on the use of metal oxide silicon field effect transistors (MOSFETs) commonly use a single device per bit. The memory package is typically organized as a two dimensional matrix of rows and columns. The gates of a multiplicity of the MOSFETs of the cells are connected to form a row. Similarly, a column is formed by coupling the source or drain regions of the MOSFET in the memory cells. Any number of rows and columns may be constructed in this manner. Depending upon whether the source or drain is connected to the column line, the source or drain remaining is capacitively coupled to ground. As the column or, as it is often called, the data line and the source or drain region, are constructed of the same material, in the prior art they are constructed as one and the same. In a like sense, one of the capacitor plates also serves as the drain or source of the MOSFET in each memory cell. It is to be particularly noted that the performance of this storage device depends to a large part on the ratio of the capacitance of the storage device to the stray capacitance of the data line. Various prior art methods exist to increase this ratio and are discussed in U.S. Pat. No. 4,012,757 (1977).

In the field of memory, there is a constant effort to reduce the area occupied by the memory cells. This area continues to occupy the majority of a memory circuit and constitutes a limitation on the reduction of size to be achieved. It is very desirable to reduce the size of the memory cells in view of economical considerations, among other reasons. However, as the overall cell size is decreased, the ratio of cell capacitance to data line capacitance also significantly decreases, thereby affecting the overall performance of the device. Thus, the overall minimum size of a memory cell is limited by the minimum acceptable memory cell capacitance ratio. This, though, is not acceptable because the memory cells now in use in 16 K bit RAMs cannot be used in a 64 K bit RAM and still maintain the same package size. See U.S. Pat. No. 4,012,757 (1977) for a memory cell commonly used in 16 K bit Random Access Memories.

In a memory cell, the cell area is occupied by four items. These four items include the channel area of the transistor, the electrode of the capacitor, the field area isolating the cell from the other cells, and the data line. This is the structure as disclosed in U.S. Pat. No. 4,012,757. It becomes desirable to remove any one of these elements from the substrate level and thereby provide decreased area requirements. Further, the operation of the device must not be hampered, such as by decreasing the capacitance ratio.

SUMMARY OF THE INVENTION

The present invention achieves a reduction of area due to the elimination of the data line at the substrate level. This data line is formed in a second layer of polysilicon. This second layer polysilicon data line contacts the substrate area formed during the drain/source doping to make an electrical connection to the terminal (source or drain) of a transistor of the memory cell. The gate of the transistor of the memory cell is also formed in the second layer of polysilicon and connected to a word line. The bottom electrode of the capacitor is formed by doping in the substrate is and connected to the transistor of the memory cell. The top electrode of the capacitor is formed in the first layer of polysilicon. This first polysilicon electrode is common to all capacitors in the memory cell array. Isolation between cells is achieved by the use of a thick field oxide.

DESCRIPTION OF THE PREFERRED EMBODIMENTS

The present invention is a one transistor - one capacitor memory cell structure used in integrated memory circuits to store a single information bit. The memory cell is a field effect transistor coupled to a capacitor which is similarly coupled to ground or a fixed potential. One terminal of the field effect transistor and a first electrode of the capacitor are an integral unit. This capacitor electrode is physically formed in the substrate and not dependent upon any inducement of an inversion field in the semiconductor surface. The second electrode of the capacitor is formed in a first polysilicon layer which may be a continuous layer throughout the memory array with exposure at the transmission channels of the field effect transistors and the point of contact between the data line and a terminal of the field effect transistor. The gate of each field effect transistor is formed in a second polysilicon layer, in which layer the data line is also formed. The data line is electrically isolated from the substrate layer except at the points in which it drops to make contact to the field effect transistor in a memory cell. By placing the data line in an upper layer of polysilicon, more substrate area is provided, thereby allowing higher density while maintaining a desired ratio of the capacitance of the memory cell to the stray capacitance of the data line. Further, the stray capacitance of the data line is decoupled from the substrate potential by the first polysilicon layer, and the problems of a changing substrate potential are avoided in this construction.

It should be clearly understood that the operation of the device is not dependent upon whether the device beings with a P-type or N-type substrate. This in turn effects whether a transistor terminal connected at a particular point is a source or a drain, as it also effects the polarity of the applied potential. Also, the term "semiconductor substrate" generally means a thick monocrystalline layer of silicon, an epitaxial layer of silicon grown in a supporting base, or a monocrystalline layer grown on an oxide layer which in turn is supported by a thick spinel or sapphire base.

Figure 1:
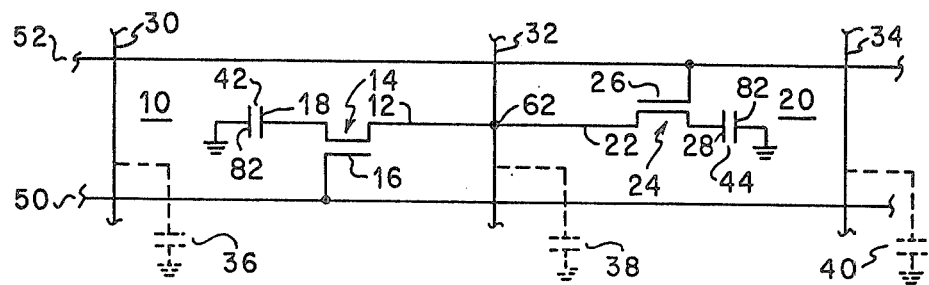
FIG. 1 is a schematic diagram of two one transistor-one capacitor memory cells.

Referring now to the drawings, FIG. 1 illustrates a portion of the memory array using a memory cell to store a single bit. The equivalent circuit includes two memory cells 10 and 20. The data lines 30, 32 and 34 have stray capacitances 36, 38 and 40. One terminal 12 of the transistor 14 is connected to the data line 32 and one terminal 22 of the transistor 24 of the memory cell 20 is connected to the data line 32. The gate 16 of the transistor 14 is connected to the word line 50, while the gate 26 of the transistor 24 is connected to the word line 52.

The terminal 18 of the transistor 12 is also connected to a first electrode of a capacitor 42 whose second electrode is connected to ground. Similarly, the terminal 28 of the transistor 24 is connected to the first electrode of a capacitor 44, whose second electrode is connected to ground. In practice, if the capacitor 42 was storing a bit of information as a charge on the capacitor 42, a signal applied to the word line 50 would cause the transistor 14 to become conductive. When the transistor 14 becomes conductive, the capacitor 42 will then discharge to the data line 32 on which the bit of information may be read. Appropriate circuitry then carries the information to an output and may recharge the capacitor.

The strength of the signal on the data line 32 is in great part dependent on the ratio of the capacitance of capacitor 42 to the stray capacitance 38. However, as cell density increases, the area allowable for a large capacitor 42 decreases. In order to achieve a much greater available area for the capacitors of the memory cell, the data line is constructed in a second polysilicon layer separate from the substrate and a first polysilicon layer is used for a second electrode of the capacitor of the memory cell. This achieves a substantial increase in available area. In this manner capacitance is not decreased, while much greater memory storage in the same area becomes available. Further, because of the process steps involved in constructing two layers of polysilicon, the first polysilicon layer constituting a second electrode of the capacitor 42 may be grounded. This avoids the fluctuations inherent in any power supply, and further increases the operational effectiveness of the device. The uniqueness of these facets can be seen with reference to the following figures.

Figure 2:
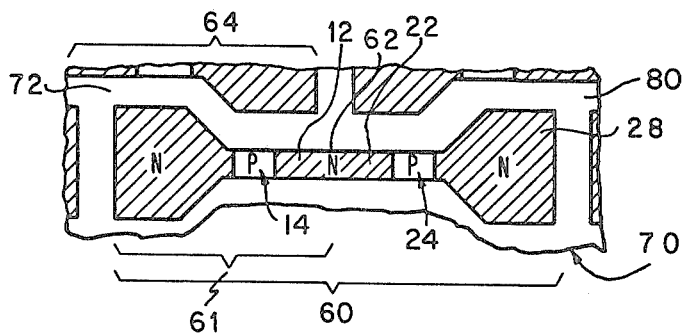
FIG. 2 is a top view of the conductive regions forming a first region in the substrate, inclding a drain, source, capacitor area, and a transmission channel.

FIG. 2 shows a region 60 comprised of N-type areas and P-type transmissions channels. This region 60 is disposed in a P-type substrate 70. In this region 60, the drains, sources, and channels of two field effect transistors for two memory cells are formed along with the two first electrodes of the two capacitors in the memory cells. The terminals 22 and 12 will also form a point of contact 62 for the data line 32 (see FIG. 4). As can be seen, the terminals 12, 22, and the point of contact 62 are a common doped region. It is also to be noted that only a portion of the full pattern of regions such as region 60 in a memory array is shown in FIG. 2. The area 72 between the region 60 and a similar region such as 64 is a P-type doped area beneath a thick field oxide to electrically isolate one region from the other. The left half of a region 60 is designated as a first region disposed in the semiconductor substrate. An arbitrarily designated "memory cell pair" includes the right half of a different region 60 (belonging to the memory cell immediately below the cell which contains the first region) and is designated as a second region disposed in the semiconductor substrate.

Figure 3:
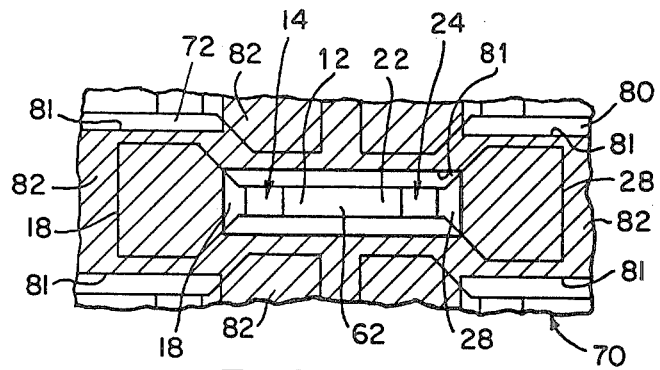
FIG. 3 is a top view showing the conductive capacitive means formed by a first polysilicon area.

In FIG. 3, a continuous layer 82 of polysilicon is grown. A window 81 is exposed to allow contact to be made to the transistor terminals 12 and 22. The transmission channels of the transistors are also exposed to allow a later process step to grow a gate region. The continuous layer 82 forms the top electrode of the capacitors 42 and 44 and every other capacitor in the memory array. This capacitative layer may then be grounded to provide a common reference potential for all cells in the memory array and avoid the plus or minus 10% variance present in power supplies.

Figure 4:
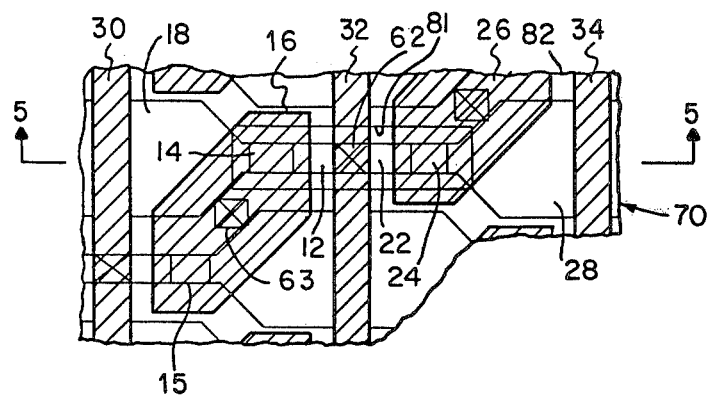
FIG. 4 is a top view showing some data lines and conductive gates extending between two transmission channels of the transistors in a memory cell pair, the data lines and conductive gates formed by a second polysilicon layer.

A second layer of polysilicon is grown as shown in FIG. 4. This layer includes the data lines 30, 32 and 34 and the gates 16 and 26 of the transistors 14 and 24, respectively. As illustrated, the gates are common with another gate region of another memory cell extending from a different data line. Thus, for example, the gate 16 of the transistor 14 which is connected to data line 32 is in common with the gate of another transistor in the memory cell which is connected to data line 30. The "X's" within rectangles or contacts 63 in FIG. 4 represent contact points. Although not shown in FIG. 4, a word line 50 is routed horizontally and is electrically coupled to these gates via contact 63 and will act to turn on the transistors. However, the outputs will be sensed on different data lines. In this manner, a memory matrix is provided. Further memory cell pairs will also be coupled to the same word line.

The data line 32 is now in a second layer of polysilicon insulated at all points other than where it makes contact with transistor pairs such as 14 and 24. At this contact point the oxide has been removed to allow a buried contact such as contact 62 to be made. Because the buried contact 62 involves transistor terminals already implemented in the substrate and a thick oxide has been grown around the contact region through succeeding steps, a self-aligning contact results. This overcomes requirements of greater contact area to insure proper contact and achieves greater density due to the lesser area requirements. Further, with the data lines at a different level in the memory circuit above the substrate, the capacitors and transistors of the memory cells can be more closely packed, achieving greater density without losing any capacitance.

Figure 5:
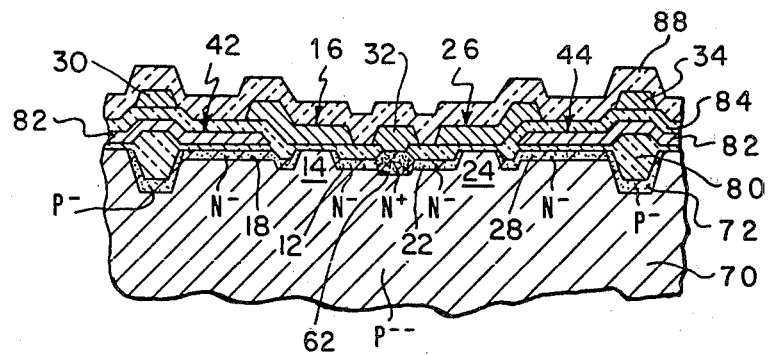
FIG. 5 is a cross-section of two memory cells of adjacent memory cell pairs.

A cross-section taken through the lines 5—5 in FIG. 4 is shown in FIG. 5. The substrate 70 is P-doped and transistors 14 and 24 are implemented in the surface. The terminals 12, 18, 22 and 28 are N-type, along with the first electrode of the capacitors 42 and 44. A buffer area 72 is P-type. A thick field oxide 80 is grown over the substrate with a contact 62 to be formed in successive steps. The first polysilicon layer 82 forms the top electrode of the capacitors 42 and 44. This electrode is preferably grounded. Another oxide layer 84 covers this layer of polysilicon. A second polysilicon layer 86 forms the data lines 30, 32 and 34, and the gates 16 and 26 over the channels of the transistors. As seen, the data line 32 is making a contact 62 at the transistors while data lines 30 and 34 are stacked over the first polysilicon capacitive layer 82. The entire circuit is then coated with an insulating oxide 88. Finally, the circuit is supplied with appropriate contacts, metal interconnects for the word lines and a protecting oxide layer, as is well known in the art.

Therefore, using the inventive concepts herein disclosed, a memory cell array with much greater density than heretofore available may be achieved without sacrificing transistor and capacitor area. Further, using this construction, better memory cell performance is obtained through a more effective capacitor. It is to be understood that further modifications and alterations may be made without departing from the spirit and scope of the present invention.

What is claimed is:

1. In an integrated circuit memory of the type including an array of memory cells fabricated on a semiconductor substrate, each cell including a gate-controlled switch and a charge storage capacitor coupled to said switch, wherein one plate of each charge storage capacitor is formed by a conductive region within said substrate, the improvement comprising a conductive sheet overlying the cells of the array and insulated with respect to each conductive substrate region, said conductive sheet defining a common plate for each capacitor in the array.

2. In an integrated circuit memory of the type including an array of memory cells fabricated on a semiconductor substrate in rows and columns, each cell including a gate-controlled switch having source and drain elements formed in the substrate and a charge storage capacitor coupled to each cell, the improvement comprising:

one element of each gate-controlled switch defining a conductive plate for the charge storage capacitor in each cell;
a layer of insulating material overlying the source and drain elements in each cell;
a sheet of conductive material overlying the insulating layer and extending over all cells of the array, said conductive sheet defining a common conductive plate for the storage capacitors of the memory array.

3. In an integrated circuit memory of the type having an array of memory cells fabricated on semiconductor substrate in rows and columns, each cell including a transistor switch having source and drain regions formed in the substrate and an insulated gate coupled to a word select line, and a charge storage capacitor electrically coupled to each transistor switch, the improvement comprising:

the drain region of each transistor switch defining a conductive plate for the charge storage capacitor in each cell;
the source regions of adjacent transistors of a pair of cells in each row being formed in common;
a layer of insulation overlying the source and drain regions of each transistor switch;
a conductive sheet overlying the insulation layer and defining a common plate for all charge storage capacitors in the array; and,
a data line electrically coupled to the common source diffusion region of each cell pair and insulated with respect to said conductive sheet.

4. The integrated circuit memory as defined in claim 3, said conductive sheet having a window opening overlying the common source diffusion region of each cell pair, said data line overlying said conductive sheet and electrically coupled to the common source diffusion region through the window opening.

5. In an integrated circuit memory of the type including an array of memory cell pairs fabricated on a semiconductor substrate, each cell including agate-controlled switch and a charge storage capacitor coupled to said switch, each switch having source and drain elements formed in active regions of the substrate and an insulated gate coupled to a word select line, the improvement comprising:

the source elements of each cell pair being formed in common;
the drain element of each gate-controlled switch defining a conductive plate for the charge storage capacitor in each cell;
a conductive sheet overlying the substrate and defining a common plate for all storage capacitors of the array, said conductive sheet being insulated with respect to the active regions of said substrate and having a window opening providing access to the common source elements of each cell pair; and,
a data line overlying the conductive sheet and electrically coupled to the common source elements of each cell pair through the window opening, said data line being insulated with respect to the conductive sheet.

* * * * *